United States Patent
Stehle et al.

(10) Patent No.: US 12,389,554 B2
(45) Date of Patent: Aug. 12, 2025

(54) CRASH PROTECTED MEMORY UNIT

(71) Applicant: HENSOLDT Sensors GmbH, Taufkirchen (DE)

(72) Inventors: Nikolaus Stehle, Meersburg (DE); Markus Metzler, Ravensburg (DE)

(73) Assignee: HENSOLDT SENSORS GMBH, Taufkirchen (DE)

( * ) Notice: Subject to any disclaimer, the term of this patent is extended or adjusted under 35 U.S.C. 154(b) by 526 days.

(21) Appl. No.: 17/467,447

(22) Filed: Sep. 7, 2021

(65) Prior Publication Data

US 2022/0073212 A1 Mar. 10, 2022

(30) Foreign Application Priority Data

Sep. 8, 2020 (EP) .................... 20195125

(51) Int. Cl.
- *H05K 5/02* (2006.01)
- *B64D 45/00* (2006.01)
- *G06F 1/20* (2006.01)
- *G06F 1/3206* (2019.01)

(52) U.S. Cl.
CPC ............. *H05K 5/021* (2022.08); *B64D 45/00* (2013.01); *G06F 1/206* (2013.01); *G06F 1/3206* (2013.01)

(58) Field of Classification Search
CPC ........ B64D 45/00; G06F 1/206; G06F 1/3206
See application file for complete search history.

(56) References Cited

U.S. PATENT DOCUMENTS

| | | | | |
|---|---|---|---|---|
| 4,694,119 A | * | 9/1987 | Groenewegen | H05K 5/0213 174/559 |
| 5,370,814 A | | 12/1994 | Salyer | |
| 5,750,925 A | * | 5/1998 | Purdom | H05K 5/0213 174/544 |

FOREIGN PATENT DOCUMENTS

| | | | |
|---|---|---|---|
| CN | 102241820 B | * | 4/2013 |
| EP | 2688377 A2 | | 1/2014 |
| RU | 2651428 C2 | | 4/2018 |

OTHER PUBLICATIONS

English Machine Translation of CN-102241820-B (Year: 2011).*

* cited by examiner

*Primary Examiner* — Andrew J Cromer
(74) *Attorney, Agent, or Firm* — FisherBroyles, LLP; James W. Hill; Andrew K. Gonsalves

(57) ABSTRACT

A crash-protected memory unit (100) for a flight recorder comprises: an electronic memory (110), configured to store data; an active casing (120), configured to encase the electronic memory (110), and comprising a heat absorption material (125), adapted to absorb heat by undergoing an endothermic chemical process, thereby providing an active thermal insulation of the electronic memory (110); and a passive casing (130), configured to encase the active casing (120), and comprising a heat resistant material (135) for providing a passive thermal insulation for the electronic memory (110).

12 Claims, 3 Drawing Sheets

CRASH PROTECTED MEMORY UNIT

The present invention relates to a crash-protected memory unit for a flight recorder of an aircraft, and a method to produce such a crash-protected memory unit.

BACKGROUND

Flight recorders are employed in most aircraft to acquire and store data of technical parameters and of events on the aircraft. Such data may e.g. comprise flight details such as air speed, direction, and altitude, performance indicators such as technical response times or fuel flow, and voice or video recordings. The data serves to address safety-related issues, along with aspects of flight procedures or aircraft system performance or status, in particular for a later reconstruction. A persistence of this data under extreme conditions, as e.g. caused in a crash of the aircraft, is therefore of high importance. Besides an advantageous positioning of the flight recorder within the aircraft, protection against physical impact and insulation against water and heat are mandatory measures, largely following standardized specifications.

Within the flight recorder, particular focus is put on a protection of the electronic memory on which this data is stored. A conventional design for such a protection is exemplified in FIG. 4, which schematically illustrates a section of a crash-protected memory unit 100, comprising an electronic memory 110 in a casing 130. The casing 130 is configured to shield the electronic memory 110 from shock and high temperature. The casing 130 typically comprises heat-resistant material, which is both stable under high temperatures and has a low thermal conductivity. A typical standard pertaining to heat resistance requires that data on the electronic memory 110 remains intact if the crash-protected memory unit 100 is exposed to a temperature of 1000° C. for a duration of up to one hour.

In conventional examples, the casing 130 comprises several layers. The electronic memory 110, possibly with further electronic components such as a power supply and a control unit, may be comprised within a plastic material and contained in a metal housing. A further layer then comprises e.g. a ceramic thermal insulation material with a thickness of 0.5 to 2 cm, configured to protect the electronic memory 110 e.g. in a fire following a crash. Finally, the outermost layer of the conventional casing 130 may consist of a titanium shell, which typically has a thickness between 0.5 and 1 cm.

As presented in this example, meeting the high standards for the protection of data in the electronic memory 110 requires thick and heavy shielding equipment. There is a demand for saving space and weight for such crash-protected memory units, while still safely meeting the protection requirements.

SUMMARY OF THE INVENTION

At least some of the above-mentioned problems are solved by a crash-protected memory unit according to claim 1, a flight recorder according to claim 10, an aircraft according to claim 11, and a method for producing a crash-protected memory unit according to claim 12. The dependent claims refer to further advantageous realizations for the subject matters of the independent claims.

The present invention relates to a crash-protected memory unit for a flight recorder. The crash-protected memory unit comprises an electronic memory, configured to store data. Furthermore, the crash-protected memory unit comprises an active casing, configured to encase the electronic memory and comprising a heat absorption material, adapted to absorb heat by undergoing an endothermic chemical process. Through this chemical process, the heat absorption material provides an active thermal insulation for the electronic memory. The crash-protected memory unit further comprises a passive casing, configured to encase the active casing and comprising a heat resistant material for providing a passive thermal insulation for the electronic memory.

The electronic memory may advantageously be sealed within, or coated by, some material as e.g. a plastic or synthetic. The endothermic chemical reaction takes place if the heat absorption material is exposed to some high temperature (such as, e.g., temperatures between 100° C., and 1000° C.). The endothermic chemical reaction is adapted to provide a cooling effect, thereby protecting the data stored in the electronic memory from damage due to heat. The term 'heat resistant' here refers to a stability under heat exposure, and/or to a low heat conductivity. Stability under heat exposure may in particular include non-flammability. Advantageously, a product of the endothermic chemical process, in particular a non-volatile component, is also heat resistant.

The form of the active casing and the form of the passive casing can differ from each other. Advantageously, at least one of them comprises a spherical surface. The active casing and the passive casing can have openings for, and/or be penetrated by, electric conduction lines, e.g. for carrying data between the electronic memory and a rest of the flight recorder.

Optionally, the crash-protected memory unit further comprises a power supply, configured to provide power to the electronic memory, and/or a controller unit, configured to control the electronic memory and/or a data flow towards and away from the electronic memory. The power supply and the controller unit may be positioned together with the electronic memory within a coating or sealing material.

Optionally, the heat absorption material is adapted to undergo the endothermic chemical process in more than one step, each step corresponding to a respective (ambient) temperature. In particular, the endothermic chemical process may itself consist of several individual endothermic processes (or unit operations), wherein a subsequent process employs a product of a preceding process as an educt. Advantageously, the individual endothermic processes set in at individual temperatures of an ordered sequence of temperatures, respectively. This may prolong the cooling effect.

Optionally, the heat absorption material comprises an inorganic hydrate, adapted to undergo, as the endothermic chemical process, a dehydration. Furthermore, in this case the passive casing and/or the active casing comprise a plurality of openings, adapted to admit a passage of gaseous water.

The dehydration of crystalline water in the inorganic hydrate produces water in gaseous form. This provides a cooling effect through an absorption of heat energy, and through outgassing of the water vapor. The cooling effect protects the electronic memory from losing data due to heat.

The inorganic hydrate may in particular be encased in form of a granulate. The granulate may e.g. be contained within one or more shells of some container material as e.g. a ceramic or a metal, each shell with respective openings, which together with the inorganic hydrate material form the active casing. The active casing may be configured to hold several different hydrates, e.g. separated in different shells.

The active and/or the passive casing can e.g. have pores as openings, adapted for the outgassing of the water molecules.

Optionally, the active casing comprises the inorganic hydrate within a container, and the container comprises at least some openings of the plurality of openings.

The container may comprise several compartments or layers. Advantageously, the container and the openings are configured to optimize the cooling effect, in particular by supporting a separation of water vapor from the dehydrated heat absorption material. The container may comprise a ceramic compound, or a metal.

The openings of the container may be adapted, in particular with respect to size and position, to optimize an outgassing process in connection with openings of the passive casing. At least some of the openings of the container may be configured to outgas water into a space still confined within the passive casing.

Optionally the absorption material comprises one or more of the following inorganic hydrates: copper(I) sulfate pentahydrate ($Cu_2SO_4 \cdot 5H_2O$), copper(II) sulfate tetrahydrate ($CuSO_4 \cdot 4H_2O$), copper(II) sulfate nonahydrate ($CuSO_4 \cdot 9H_2O$, enneahydrate), copper(II) sulfate pentahydrate ($CuSO_4 \cdot 5H_2O$), another copper sulfate hydrate.

Copper sulfate hydrates can dehydrate or decompose in steps, which is particularly advantageous for the presented crash-protected memory unit. It is known that copper(II) sulfate pentahydrate, for example, decomposes in three steps. An initial copper(II) sulfate pentahydrate molecule loses two water molecules in both a first and a second of the three steps. The temperatures at which these two steps occur are roughly around 90° C. and around 110° C., respectively; these different temperatures are related to different bonding structures of the first two water molecules as opposed to the second two water molecules. In a third step, taking place in an ambient temperature of around 200° C., a fifth water molecule is lost.

Optionally, at least one opening of the plurality of openings is filled with a sealing material, and a melting or sublimation point of the sealing material is related to a dehydration temperature of the inorganic hydrate.

For at least some of the openings, the sealing material can comprise e.g. lead, or a lead-based solder. Different sealing materials (as e.g. a solder with different additives), with respective melting or sublimation temperatures, may be employed for different openings in order to optimize the cooling effect for the electronic memory. A particular melting temperature of the sealing material of a given opening may be adapted to a water gas pressure built up by water produced in the endothermic chemical reaction or dehydration. In this way, melted sealing material may be pressed out of the opening in a particular direction due to water vapor pressure.

Optionally the heat resistant material comprises a microporous material, containing one or more of the following: a ceramic material, silicon, aluminum, asbestos, silicic acid. In particular, the passive casing may comprise an outer layer made of titanium, as a shell to provide additional shock protection to an interior of the passive casing, and an inner layer comprising a ceramic insulation material.

Optionally, a thickness of the active casing and/or of the passive casing is adapted to keep the stored data in the electronic memory intact if the crash-protected memory unit is exposed to a predefined temperature, in particular 1000° C., for a predefined period of time, in particular 20 minutes or one hour. Here requirements may also pertain to ranges including this temperature, as e.g., for 20 minutes or 60 minutes, 1000°–1100° C., or 800°–1200° C.

Embodiments also relate to a flight recorder, comprising the crash-protected memory unit as described above.

Embodiments further relate to an aircraft, comprising the flight recorder with the crash-protected memory unit as described above.

Embodiments further relate to a method for producing a crash protected memory for a flight recorder.

The method comprises a step of providing a casing in form of two half-shells, which may be either components of the active casing or components of the passive casing, a heat absorption material, and an electronic memory. The form of either of the half-shells does not need not to be spherical.

A further step comprises pressing the heat absorption material into the half-shells, which in particular may involve a crushing or granulating of the heat absorption material.

A further step comprises forming one or more indentations in the heat absorption material. In addition, space for an electric or electronic connection of the electronic memory to a rest of the flight recorder may be formed in the heat absorption material.

A further step comprises inserting (or embedding) the electronic memory in the one or more indentations. In addition, the electric or electronic connection of the electronic memory to the rest of the flight recorder may be inserted into the heat absorption material.

A further step comprises combining the half-shells holding the absorption material and the electronic memory, in order to produce the crash-protected memory unit.

Optionally, the step of combining the half-shells comprises one or more of the following: a wielding, a sealing of openings, and/or an establishing of an interlocking engagement using a thread, a bayonet joint, a hook, or another mechanical connection.

In summary, the proposed crash-protected memory unit combines a passive with an active cooling mechanism. The active cooling concept is achieved by a chemical transformation process which enhances the effectiveness of cooling the electronic memory inside the CPM in case of fire and high temperature. This chemical transformation process is only set in motion under heat exposure, and results in the conversion of the aggregation state of the active insulation material, which then becomes refrigerative. According to embodiments, active cooling is achieved by employing a chemical reaction of copper(II) sulfate hydrates, in particular copper(II) sulfate pentahydrate. Under fire exposure, the hydrate or hydrates will be heated, and successively split off water molecules. Through this vaporization of water, the cooling effect is set in motion.

The active insulation boosts the cooling process, and therefore less passive insulation material is needed. This offers the advantage of a lightweight, small, and less voluminous crash protected memory unit.

The proposed crash-protected memory unit in particular offers the advantage that openings, i.e. ducts, in the outer passive casing allow water vapor to pour out of the unit, thereby cooling the interior of the unit. If the active casing and/or the passive casing each comprise several layers, the openings may be arranged in each layer to form a system that supports this outgassing of water vapor. This support may in particular be provided by varying a size and a density of the openings in the different layers. The openings may initially be sealed by different sealing materials, e.g. lead or solders with admixtures to control (or at least influence) a temperature and/or a pressure at which the sealing material melts or sublimates in order to admit the outgassing through the respective opening.

The proposed principle is not tied to a specific form of the memory encasing. The electronic memory may be housed in a casing shaped as a sphere, cuboid, pyramid, or any other form. Depending on the integration of the electronic memory in the light recorder, the casing may not fully encapsulate the memory in every direction. Its shape is advantageously adapted to that of the flight recorder, and/or to other components of the flight recorder.

The proposed crash-protected memory unit can be included in aircraft such as helicopters, lightweight or heavy airplanes, vertical take-off and landing (VTOL) aircraft. The proposed principle is not tied specifically to an application in a flight recorder, and may also find applications in other vehicles, such as e.g. automobiles.

BRIEF DESCRIPTION OF DRAWINGS

Various embodiments of the present invention will be described in the following by way of examples only, and with respect to the accompanying drawings, in which.

DETAILED DESCRIPTION

Various examples will now be described more fully with reference to the accompanying drawings in which some examples are illustrated.

Accordingly, while examples are capable of various modifications and alternative forms, the illustrative examples in the figures will herein be described in detail. It should be understood, however, that there is no intent to limit examples to the particular forms disclosed, but on the contrary, examples are to cover all modifications, equivalents, and alternatives falling within the scope of the disclosure. Like reference numbers refer to like or similar elements throughout the description of the figures.

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
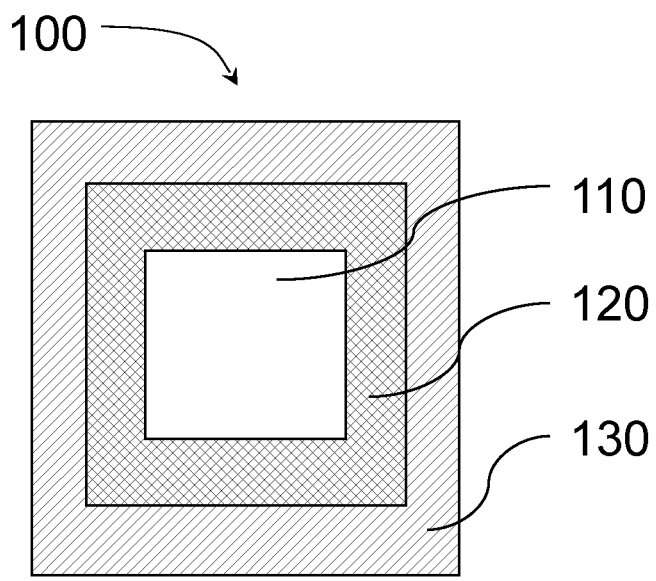
FIG. 1 illustrates a crash-protected memory unit for a flight recorder according to the present invention.

FIG. 1 schematically illustrates a section of an embodiment of a crash-protected memory unit 100 for a flight recorder according to the present invention. The crash-protected memory unit 100 comprises an electronic memory 110, configured to store data, and an active casing 120, configured to encase the electronic memory 110. The active casing 120 comprises a heat absorption material, adapted to absorb heat by undergoing an endothermic chemical process, thereby providing an active thermal insulation (i.e., a cooling effect) for the electronic memory 110. The crash-protected memory unit 100 further comprises a passive casing 130, configured to encase both the electronic memory 110 as well as the active casing 120. The passive casing 130 comprises a heat resistant material, which is designed to provide a passive thermal insulation for the electronic memory 110.

In addition to the electronic memory 110, the active casing 120 (and therefore the passive casing 130) may encase further electronic components, in particular a power supply for the electronic memory 110, and a control unit for controlling the flow of data for the electronic memory 110. Together with these further electronic components, the electronic memory 110 may be embedded within a sealing material (e.g. a plastic or other synthetic).

The active encasing 120 and the passive encasing 130 do not necessarily wrap the electronic memory 110 entirely, and may depend on a geometry of other components in the flight recorder.

Figure 2:
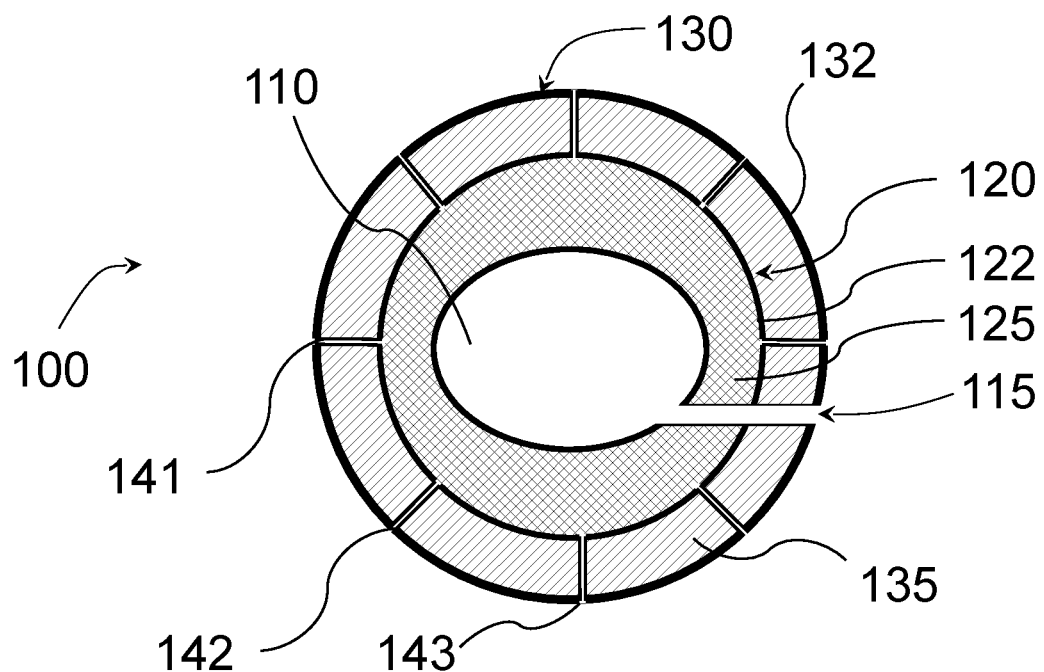
FIG. 2 illustrates a further embodiment of the crash-protected memory unit.

FIG. 2 schematically illustrates a section of a further embodiment of the crash-protected memory unit 100, showing some more details.

The active casing 120 and the passive casing 130 do not wrap the electronic memory 110 entirely, but provide space for a wired or wireless interface as an electric connection 115, configured to enable a data transfer between other components of the flight detector and the electronic memory 110. The electric connection 115 may in particular comprise an ethernet cable and/or plug and/or a wireless connection.

The active casing 120 comprises a container 122 for a heat absorption material, which in this embodiment is an inorganic hydrate 125, as e.g. copper(II) sulfate pentahydrate, in form of a granulate. Advantageously, the inorganic hydrate 125 is configured to undergo the endothermic chemical process in a sequence of steps corresponding to a sequence of temperatures (or temperature ranges). This can be achieved by a sequence of dehydration processes starting from a single-substance inorganic hydrate 125 (as e.g. the aforementioned sequence starting from copper(II) sulfate pentahydrate), or by a combination of different inorganic hydrates 125 or other heat absorption materials. In particular, the active casing 120 can comprise layers of different inorganic hydrates 125, adapted in quality, thickness and arrangement to optimize the sequence of dehydration processes in order to protect the data on the electronic memory 110 from damage due to heat.

In the present embodiment, the passive casing 130 comprises an outer titanium shell 132, and a layer of a ceramic insulation material 135.

The present embodiment comprises a plurality of openings 141, 142, . . . , configured to release water molecules produced by dehydration of the inorganic hydrate 125 into an environment of the crash-protected memory unit 100. These openings 141, 142, . . . may e.g. be pores, piercing the passive casing 130. Positions of these openings 141, 142, . . . may depend on a distribution of the inorganic hydrate 125 in the active layer 120. The openings 141, 142, . . . may be sealed with a sealing material, as e.g. lead or a solder, which has a melting point adapted to improve an outgassing of water from the crash-protected memory unit 100.

In embodiments where the endothermic process comprises several individual dehydration processes or steps at successively higher temperatures, a first subset of the plurality of openings 141, 142, . . . may be sealed with a material which has a lower melting or sublimation temperature than the lowest dehydration temperature, while the material in the other openings only melts at higher temperatures. The openings of this subset, and the melting temperature of their sealing material, may be adapted such that the first dehydration process leads to a pressure in an interior of the passive encasing 130, arising due to water vapor from the first dehydration process. This pressure may support an ejection of the sealing material in a direction out of the crash-protected memory-unit 100, and furthermore may provide a cooling effect on the vapor which has left the crash-protected memory unit 100.

Shapes of the components (in particular the casings 120, 130 or their parts 122, 125, 132, 135, the openings 141, 142, . . . , or the electric connection 115) do not need to be as depicted in this figure. In particular, a shape of the active casing 120 may differ from a shape of the passive casing 130. As shown in the figure, the passive casing 130 may have the form of a spherical shell, while the active casing 120 has a spherical and an ellipsoid surface, but for both casings 120, 130 other shapes may be more useful. The casings 120, 130 may in particular also form additional hollow spaces or voids, either evacuated or filled e.g. with some inert gas (like air). Shapes should however be chosen such that requirements for the protection of the electronic memory unit 110 (or of its data), as those mentioned above, are met. Advantageously, shapes or forms of the components of the crash-protected memory 100 are adapted to a geometry of the flight recorder, or to further components of the flight recorder. As suggested by the electric connection 115, the casings 120, 130 do not need to encapsulate the electronic memory 110 fully, but may instead leave open spaces, especially if an attachment of further electric or electronic units of the flight recorder is required.

Figure 3:
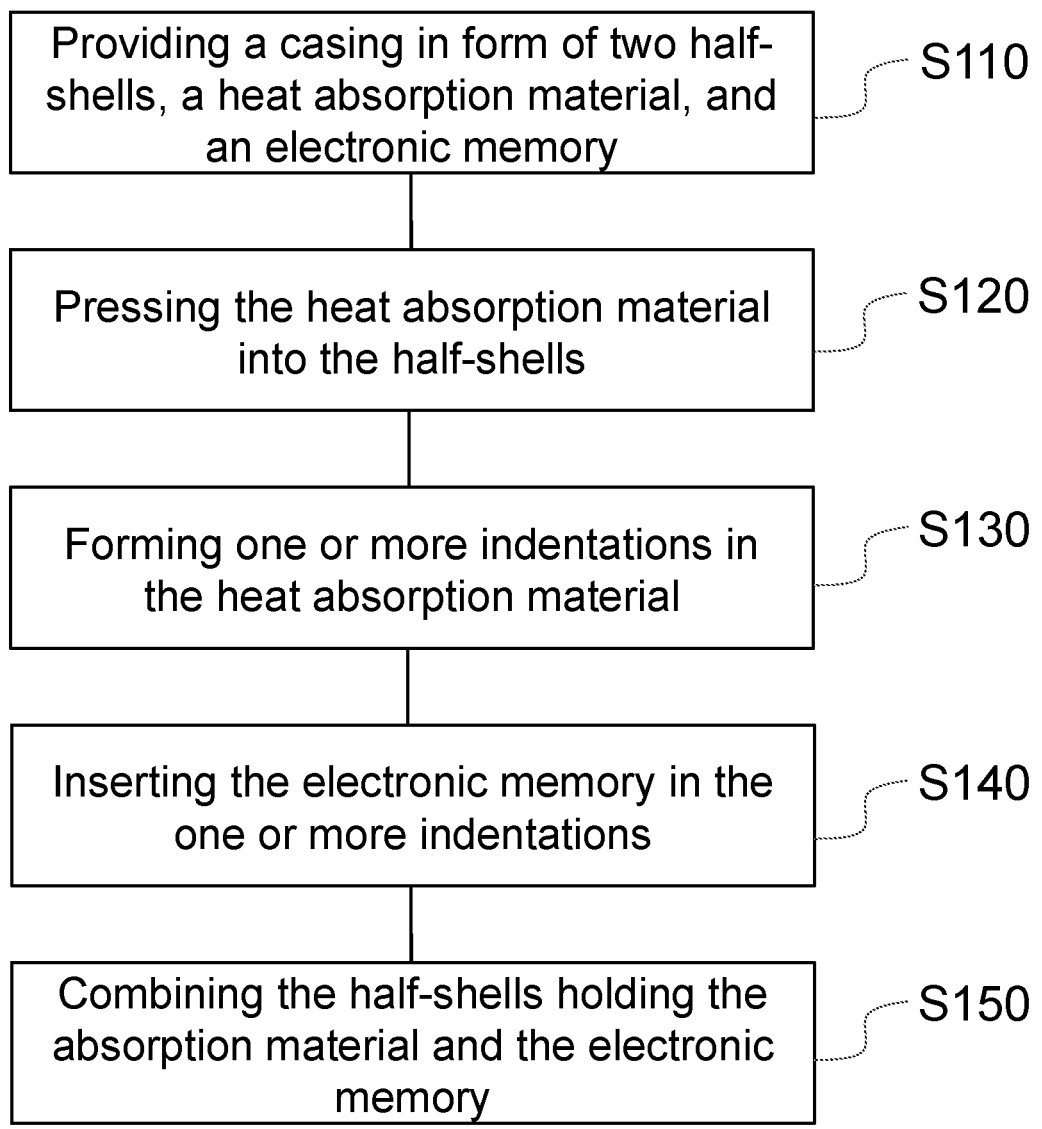
FIG. 3 shows steps of a method to produce an embodiment of the crash-protected memory unit.
Figure 4:
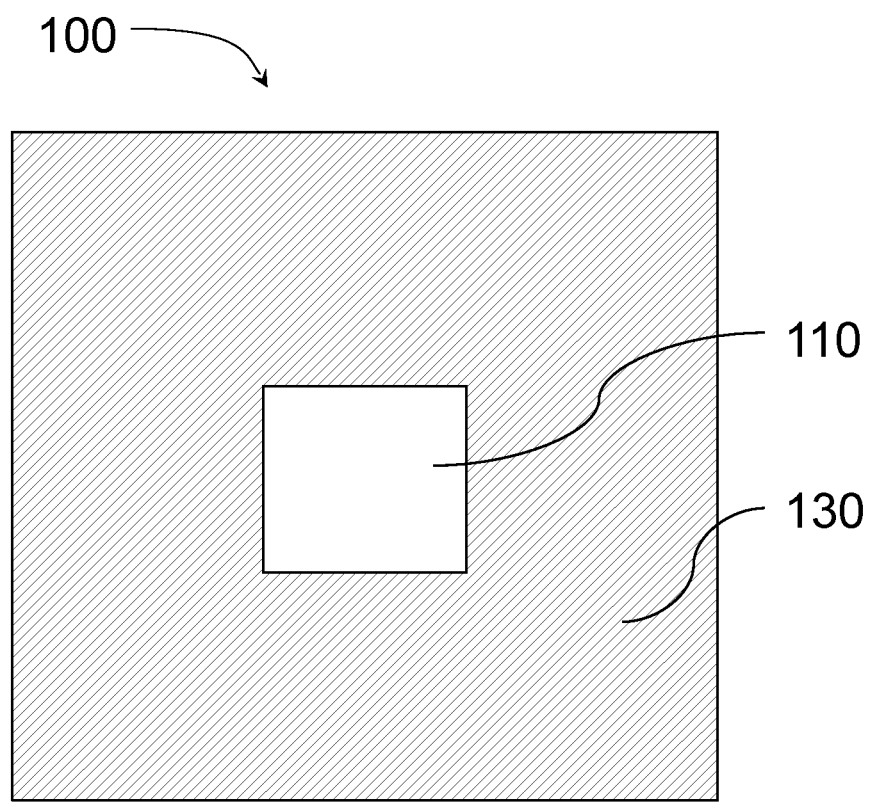
FIG. 4 illustrates a conventional crash-protected memory unit for a flight recorder.

FIG. 3 shows steps of a method for producing the crash protected memory 100. The method is characterized by the following steps. A first step comprises providing S110 a casing in form of two half-shells, a heat absorption material 125, and an electronic memory 110. The two half-shells may be part of a container 122 for the heat absorption material 125, altogether forming the active casing 120. The two half-shells may however also form (at least a part of) the passive casing 130. A further step comprises pressing S120 the heat absorption material 125 into the half-shells. The heat absorption material 125 may be crushed during the pressing S120, such as to make the heat absorption material 125 fit well within the half-shell. A further step comprises forming S130 one or more indentations in the heat absorption material 125. A next step comprises inserting S140 the electronic memory 110, along with electric connections 115 to a rest of the flight recorder, and optionally also with further electronic components such as a power supply and/or a control unit, in the one or more indentations. A further step comprises a combining S150 of the half-shells holding the absorption material 125 and the electronic memory 110, in order to produce the crash-protected memory unit 100.

The two half-shells may e.g. be combined by welding, or they may combine by means of a thread, a bayonet joint, or one or more hooks. Openings remaining after combining S150 the half-shells may be sealed at a later stage.

The description and drawings merely illustrate the principles of the disclosure. It will thus be appreciated that those skilled in the art will be able to devise various arrangements that, although not explicitly described or shown herein, embody the principles of the disclosure and are included within its scope.

Furthermore, while each embodiment may stand on its own as a separate example, it is to be noted that in other embodiments the defined features can be combined differently, i.e. a particular feature described in one embodiment may also be realized in other embodiments. Such combinations are covered by the disclosure herein.

Although the invention has been illustrated and described in detail by way of preferred embodiments, the invention is not limited by the examples disclosed, and other variations can be derived from these by the person skilled in the art without leaving the scope of the invention. It is therefore clear that there is a plurality of possible variations. It is also clear that embodiments stated by way of example are only really examples that are not to be seen as limiting the scope, application possibilities or configuration of the invention in any way. In fact, the preceding description and the description of the figures enable the person skilled in the art to implement the exemplary embodiments in concrete manner, wherein, with the knowledge of the disclosed inventive concept, the person skilled in the art is able to undertake various changes, for example, with regard to the wavelength ranges of the sensors, functioning or arrangement of individual elements stated in an exemplary embodiment without leaving the scope of the invention, which is defined by the claims and their legal equivalents, such as further explanations in the description.

LIST OF REFERENCE SIGNS 100 crash-protected memory unit
110 electronic memory
115 electric connection
120 active casing
122 container for heat absorption material
125 heat absorption material/inorganic hydrate
130 passive casing
132 titanium shell
135 ceramic insulation layer
141, 142, . . . plurality of openings
S110, S120, . . . steps of a method

The invention claimed is:

1. A crash-protected memory unit for a flight recorder, the crash-protected memory unit comprising:
   an electronic memory, configured to store data;
   an active casing, configured to encase the electronic memory, and comprising a heat absorption material, adapted to absorb heat by undergoing an endothermic chemical process, thereby providing an active thermal insulation of the electronic memory;
   a passive casing, configured to encase the active casing, and comprising a heat resistant material for providing a passive thermal insulation for the electronic memory,
   wherein the heat absorption material comprises an inorganic hydrate, adapted to undergo, as the endothermic chemical process, a dehydration,
   wherein the passive casing and/or the active casing comprise a plurality of openings, adapted to admit a passage of gaseous water, and
   wherein the heat absorption material comprises one or more of the following inorganic hydrates:
      copper(I) sulfate pentahydrate,
      copper(II) sulfate tetrahydrate,
      copper(II) sulfate nonahydrate, and/or
      copper(II) sulfate pentahydrate;

wherein dehydration of the one or more inorganic hydrates provides a cooling effect through an absorption of heat energy when undergoing the endothermic chemical process; and wherein the passive casing comprises a spherical surface enclosing the active casing and the electronic memory.

2. The crash-protected memory unit of claim 1, further comprising one or more of the following:
- a power supply, configured to provide power to the electronic memory,
- a controller unit, configured to control the electronic memory.

3. The crash-protected memory unit of claim 1, wherein the heat absorption material is adapted to undergo the endothermic chemical process in more than one stage, each stage corresponding to a respective ambient temperature.

4. The crash-protected memory unit of claim 1, wherein the active casing (120) comprises the inorganic hydrate within a container, and the container comprises at least some openings of the plurality of openings.

5. The crash-protected memory unit of claim 1, wherein at least one opening of the plurality of openings is filled with a sealing material, and wherein a melting or sublimation point of the sealing material is related to a dehydration temperature of the inorganic hydrate.

6. The crash-protected memory unit of claim 1, wherein the heat resistant material comprises a microporous material containing one or more of the following:
- a ceramic material,
- silicon,
- aluminum,
- asbestos,
- silicic acid.

7. The crash-protected memory unit of claim 1, wherein a thickness of the active casing and/or of the passive casing is adapted to keep the stored data in the electronic memory intact if the crash-protected memory unit is exposed to a predefined temperature, in particular 1000° C., for a predefined period of time, in particular 20 minutes or one hour.

8. A flight recorder, comprising the crash-protected memory unit of claim 1.

9. An aircraft, comprising the flight recorder of claim 8.

10. A method for producing a crash protected memory, comprising the steps:
- providing a casing in form of two half-shells, a heat absorption material, and an electronic memory;
- pressing the heat absorption material into the half-shells;
- forming one or more indentations in the heat absorption material;
- inserting the electronic memory in the one or more indentations;
- combining the half-shells holding the heat absorption material and the electronic memory in order to produce the crash-protected memory unit, wherein the heat absorption material comprises an inorganic hydrate, adapted to undergo, as the endothermic chemical process, a dehydration, wherein the passive casing and/or the active casing comprise a plurality of openings, adapted to admit a passage of gaseous water, and wherein the heat absorption material comprises one or more of the following inorganic hydrates:
- copper(I) sulfate pentahydrate,
- copper(II) sulfate tetrahydrate,
- copper(II) sulfate nonahydrate, and/or
- copper(II) sulfate pentahydrate;

wherein dehydration of the one or more inorganic hydrates provides a cooling effect through an absorption of heat energy when undergoing the endothermic chemical process; and wherein the passive casing comprises a spherical surface enclosing the active casing and the electronic memory.

11. The method of claim 10, wherein combining the half-shells comprises one or more of the following:
- a welding,
- a sealing of openings,
- an establishing of an interlocking engagement using a thread, a bayonet joint, a hook, or another mechanical connection.

12. The crash-protected memory unit of claim 1, wherein the one or more inorganic hydrates are copper (II) sulfate hydrates, $CuSO_4 \cdot nH_2O$, wherein n is a number of water molecules of hydration, and n can range from 1 to 9.

* * * * *